(12) United States Patent
Tran et al.

(10) Patent No.: US 9,659,943 B1
(45) Date of Patent: May 23, 2017

(54) PROGRAMMABLE INTEGRATED CIRCUITS AND METHODS OF FORMING THE SAME

(71) Applicant: Globalfoundries Singapore Pte. Ltd., Singapore (SG)

(72) Inventors: Xuan Anh Tran, Singapore (SG); Eng Huat Toh, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 15/063,963

(22) Filed: Mar. 8, 2016

(51) Int. Cl.
| | |
|---|---|
| H01L 27/11 | (2006.01) |
| H01L 21/82 | (2006.01) |
| H01L 29/423 | (2006.01) |
| H01L 27/112 | (2006.01) |
| H01L 29/06 | (2006.01) |
| H01L 29/08 | (2006.01) |
| H01L 23/528 | (2006.01) |
| H01L 21/762 | (2006.01) |
| H01L 21/8234 | (2006.01) |
| H01L 27/088 | (2006.01) |
| H01L 27/1157 | (2017.01) |
| H01L 29/78 | (2006.01) |
| H01L 27/11524 | (2017.01) |
| H01L 27/11517 | (2017.01) |
| H01L 27/115 | (2017.01) |

(52) U.S. Cl.
CPC .. *H01L 27/11206* (2013.01); *H01L 21/76224* (2013.01); *H01L 21/823431* (2013.01); *H01L 21/823481* (2013.01); *H01L 23/528* (2013.01); *H01L 27/0886* (2013.01); *H01L 27/115* (2013.01); *H01L 27/1157* (2013.01); *H01L 27/11517* (2013.01); *H01L 27/11524* (2013.01); *H01L 29/0649* (2013.01); *H01L 29/0847* (2013.01); *H01L 29/42328* (2013.01); *H01L 29/42344* (2013.01); *H01L 29/7841* (2013.01)

(58) Field of Classification Search
CPC ............... H01L 21/77; H01L 21/7624; H01L 21/823481; H01L 21/8229; H01L 27/115; H01L 27/11517; H01L 27/11524; H01L 27/11526; H01L 27/11529; H01L 27/1157; H01L 29/42328; H01L 29/42344; H01L 29/0847
See application file for complete search history.

(56) References Cited

U.S. PATENT DOCUMENTS

2014/0015029 A1* 1/2014 Hsu .................. H01L 21/28273 257/316

* cited by examiner

*Primary Examiner* — Thanhha Pham
(74) *Attorney, Agent, or Firm* — Lorenz & Kopf, LLP

(57) ABSTRACT

Integrated circuits and methods of forming the same are provided. An exemplary integrated circuit includes a semiconductor substrate having a central shallow trench isolation (STI) region. A pair of select transistors have drain regions in contact with opposite portions of the central STI region. A central gate structure overlies the central STI region and includes a central gate dielectric layer. The central gate dielectric layer has a medial dielectric region overlying the central STI region, a first lateral dielectric region overlying the first drain region, and a second lateral dielectric region overlying the second drain region. The first lateral dielectric region defines a first programmable element and the second lateral dielectric region defines a second programmable element.

20 Claims, 5 Drawing Sheets

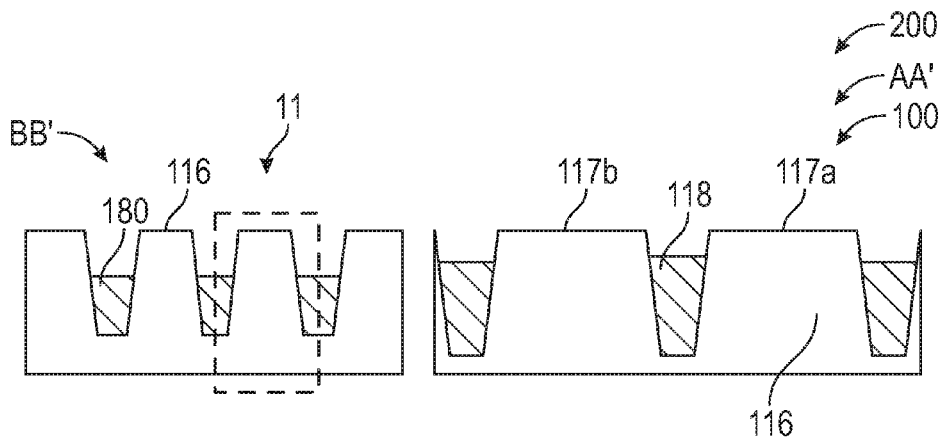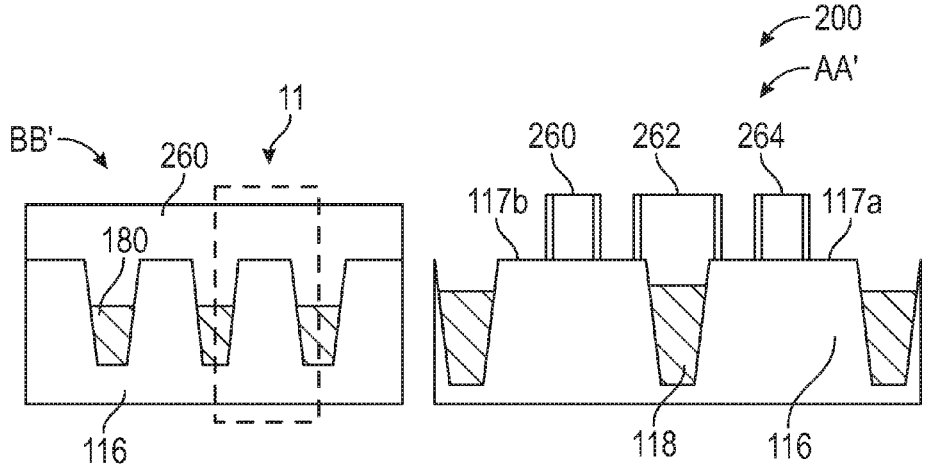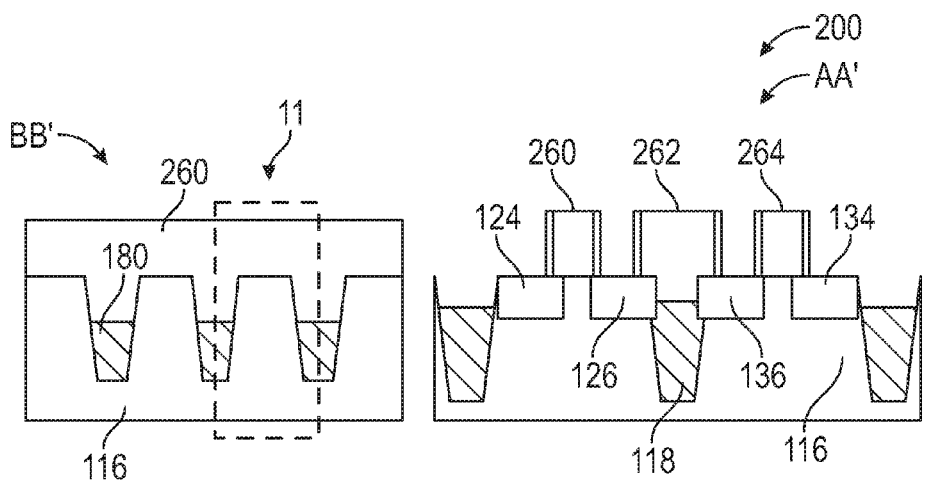

PROGRAMMABLE INTEGRATED CIRCUITS AND METHODS OF FORMING THE SAME

TECHNICAL FIELD

The technical field generally relates to programmable integrated circuits and methods of forming the same, and more particularly relates to one-time programmable/multi-time programmable integrated circuits having relatively small unit cell areas and methods of forming the same.

BACKGROUND

One-time programmable (OTP) and multiple-time programmable (MTP) memory devices are employed to meet various non-volatile memory requirements of many applications while offering low power operation, low cost, and excellent reliability while maintaining compatibility with existing complementary metal-oxide semiconductor (CMOS) processes without the need for extra masks. As a result, CMOS logic compatible MTP/OTP embedded memory provides a cost effective and simple process that is flexible among foundries. OTP and MTP memory devices also provide solutions that can be tailored to the specific application. For example, OTP memory devices may often be implemented with a small device footprint while MTP memory devices provide a high number of write/erase cycles from a single unit cell.

Known programmable cells include a select transistor coupled in series with a program transistor. A bitline is connected to a source region of the select transistor. When a normal supply voltage such as an I/O or core voltage is applied to the gates of the programmable cell, no current is sensed along the bitline. The equivalent circuit for the program transistor is a capacitor. Since there is no current that flows along the bitline, the cell is "0" by default. When a large programming voltage is applied along the gate of the program transistor, gate dielectric breakdown occurs and a resistive path is created. The equivalent circuit for the program transistor becomes a resistor. A normal supply voltage applied to the gates of the programmable cell after programming result in current flow along the bitline and a "1" is sensed. The program transistors can be programmed at any time. Once programmed, the program transistors of an OTP memory cell cannot be reverted back to a "0". In contrast, the program transistors of a MTP memory cell can be reverted back to a "0".

In the known programmable cell, there is a select transistor for each distinct program transistor. Stated differently, two adjacent programmable memory cells would have a total of four distinct transistors. Reducing the overall size of transistors and memory devices allows for, among other benefits, increased yield, reduced, heat, and lower operating voltage. However, simply reducing the distance between adjacent memory cells may yield undesirable results. For example, programming voltage used to program one cell (the target cell) can leak to a cell adjacent the target cell causing potential dielectric damage and poor cell performance.

Accordingly, it is desirable to provide integrated circuits including programmable memory devices that have a smaller device footprint along with reliable performance while maintaining effective isolation between the cells of the device. Further, it is desirable to provide methods of forming the integrated circuits that have the smaller device footprint within existing fabrication schemes without the need for added masking and patterning techniques. Furthermore, other desirable features and characteristics will become apparent from the subsequent detailed description and the appended claims, taken in conjunction with the accompanying drawings and this background.

BRIEF SUMMARY

Integrated circuits and methods of forming the same are provided herein. In an embodiment, an integrated circuit includes a semiconductor substrate having a central shallow trench isolation (STI) region and a unit cell. The unit cell includes a first select transistor, a second select transistor, and a central gate structure overlying the central STI region. The first select transistor has a first select gate structure, a first source region, and a first drain region in contact with a first portion of the central STI region. The second select transistor has a second select gate structure, a second source region, and a second drain region in contact with a second portion of the central STI region. The first drain region is opposite of the second drain region relative to the central STI region. The central gate structure includes a central gate dielectric layer having a medial dielectric region overlying the central STI region between the first drain region and the second drain region, a first lateral dielectric region overlying the first drain region, and a second lateral dielectric region overlying the second drain region. The first lateral dielectric region defines a first programmable element and the second lateral dielectric region defines a second programmable element.

In another embodiment, a method of forming an integrated circuit includes providing a semiconductor substrate having a first semiconductor fin and a second semiconductor fin and forming a recessed central shallow trench isolation (STI) region between the first and second semiconductor fins. The method further includes forming a first select transistor overlying a top surface of the first semiconductor fin, and forming a second select transistor overlying a top surface of the second semiconductor fin. The first select transistor has a first drain region in contact with a first portion of the recessed central STI region and the second select transistor has a second drain region in contact with a second portion of the recessed central STI region. The method further includes forming a central gate structure overlying the recessed central STI region.

In another embodiment, an integrated circuit includes a semiconductor substrate having a first semiconductor fin and a second semiconductor fin with a recessed central shallow trench isolation (STI) region disposed there between and a unit cell. The unit cell includes a first select transistor, a second select transistor, and a central gate structure. The first select transistor overlies the first semiconductor fin and has a first select gate structure, a first source region, and a first drain region in contact with a first side of the recessed central STI region. The second select transistor overlies the second semiconductor fin and has a second select gate structure, a second source region, and a second drain region in contact with second side of the recessed central STI region opposite the first side. The central gate structure overlies the recessed central STI region and has a central dielectric layer. The central dielectric layer has a medial dielectric region formed on the recessed central STI region between the first drain region and the second drain region, a first lateral dielectric region in contact with the first drain region, and a second lateral dielectric region in contact with the second drain region. The first lateral dielectric region defines a first programmable element and the second dielectric lateral region defines a second programmable element.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
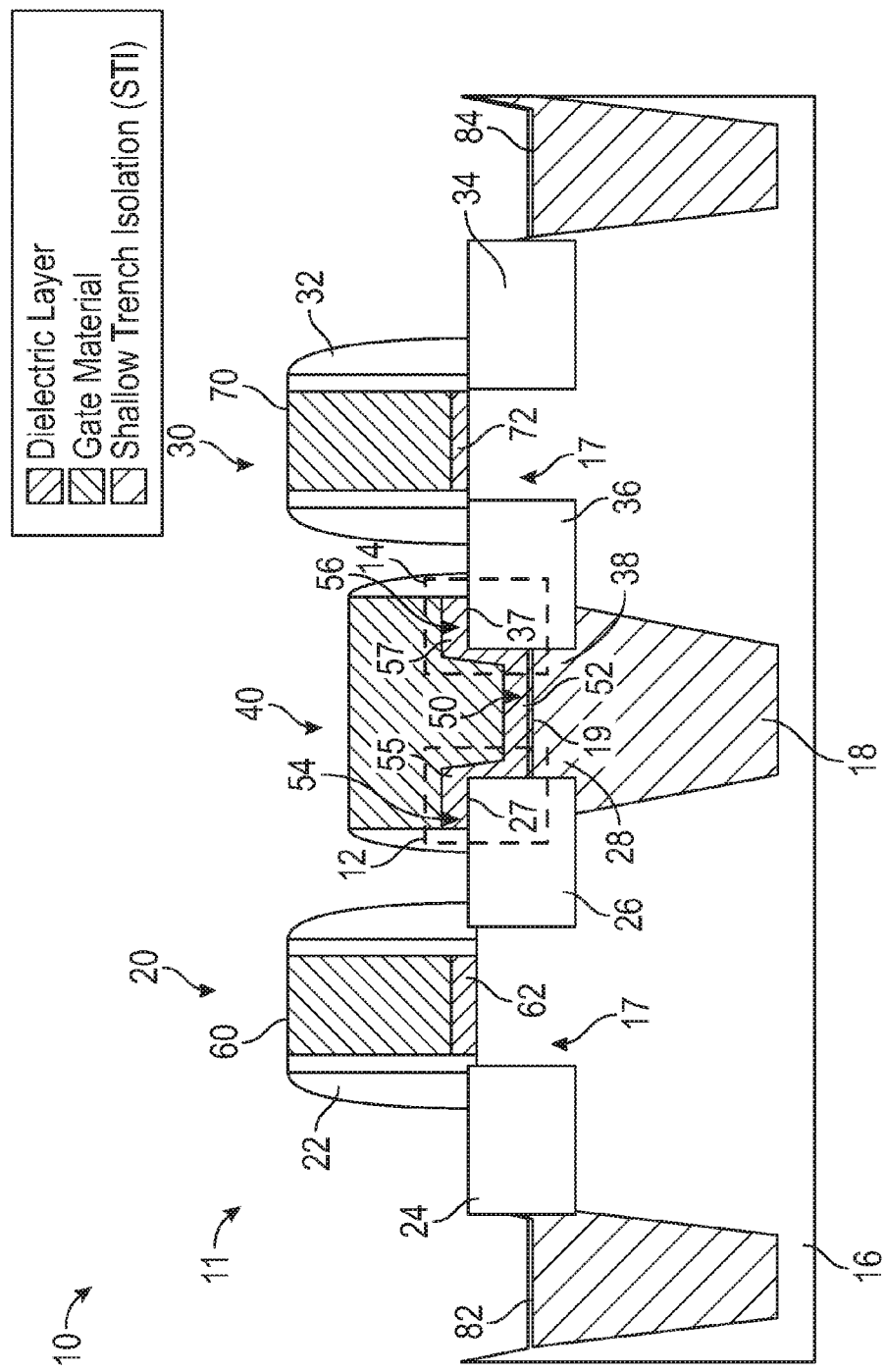
FIG. 1 is a schematic cross-sectional side view of an integrated circuit along line A-A' circuit diagram of FIG. 2 in accordance with an embodiment.

The following detailed description is merely exemplary in nature and is not intended to limit the programmable integrated circuits and methods of forming the same as described herein. The term "programmable memory device" will be used herein to broadly encompass memory devices that function either as a one-time programmable (OTP) or a multi-programmable (MTP) integrated circuit, as well as memory devices that may function as both an OTP and an MTP integrated circuit. Furthermore, there is no intention to be bound by any theory presented in the preceding background or the following detailed description.

Embodiments of the present disclosure are generally directed to integrated circuits and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Integrated circuits that include programmable memory devices and methods of forming the integrated circuits are provided herein. In particular, a unit cell includes a pair of select transistors and two programmable memory elements that are incorporated into a single central gate structure that overlies a central shallow trench isolation (STI) region. In embodiments, the programmable memory elements are OTP memory elements. In embodiments, the programmable memory elements are MTP memory elements.

The drain regions of the select transistors are in contact with opposite sides of the central STI region. In particular, in embodiments, the drain regions are in direct physical contact with the STI region. The central gate structure has a central gate dielectric layer including a medial dielectric region that overlies the central STI region and first and second lateral dielectric regions that overlie each of the drain regions of the select transistors, respectively. In embodiments, the first and second lateral dielectric regions are disposed directly on each of the drain regions of the select transistors with no intervening layers between the first and second lateral dielectric regions and the drain regions. The lateral dielectric regions define programmable memory elements for the integrated circuit. Accordingly, two programmable memory elements are incorporated into a single central gate structure to allow for a smaller device footprint, as compared to conventional devices that require four distinct transistors for a comparable configuration, without compromising performance by maintaining isolation between the memory elements of the device.

With reference to FIG. 1, an exemplary embodiment of an integrated circuit 10 that includes two programmable memory elements 12, 14 will now be described. FIG. 1 is a schematic cross-sectional side view of the integrated circuit 10 taken along the line A-A' shown in the circuit diagram of FIG. 2. The integrated circuit 10 includes a semiconductor substrate 16. As used herein, the term "semiconductor substrate" will be used to encompass semiconductor materials that are conventionally used in the semiconductor industry. "Semiconductor materials" include monocrystalline silicon materials, such as relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, and the like. In embodiments, the semiconductor substrate is a silicon substrate. The silicon substrate may be a bulk silicon wafer or may be a thin layer of silicon on an insulating layer (commonly known as silicon-on-insulator or SOI) that, in turn, is supported by a carrier wafer.

In the embodiment shown in FIG. 1, a central shallow trench isolation (STI) region 18 is disposed in the semiconductor substrate 16 to electrically isolate structures formed in and on the central STI region 18. It should be appreciated that the integrated circuit 10 may include repeated components and structures which will be described herein with respect to a unit cell 11. As referred to herein, the term "unit cell" is understood to mean that the structure of the integrated circuit 10 depicted in the Figures is repeated throughout the entirety of the integrated circuit 10. Accordingly, while a single unit cell 11 having two programmable memory elements 12, 14 is depicted herein for simplicity and understanding, this should in no way limit the integrated circuit 10 as described herein to only having a single unit cell 11 on the semiconductor substrate 16.

The integrated circuit 10 has a central gate structure 40 overlying the central STI region 18. The central gate structure 40 has a central dielectric layer 50 including a medial dielectric region 52, a first lateral dielectric region 54, and a second lateral dielectric region 56. In embodiments and as shown in FIG. 1, the medial dielectric region 52 overlies the central STI region 18 between the first drain region 26 and the second drain region 36. The first lateral dielectric region 54 overlies the first drain region 26 and the second lateral dielectric region 56 overlies the second drain region 36. The first lateral dielectric region 54 defines the first programmable memory element 12 and the second lateral dielectric region 56 defines the second programmable memory element 14. The central gate structure 40 further includes a central gate 42 overlying the central dielectric layer 50. In embodiments, the central dielectric layer 50 is a high-k dielectric layer.

The integrated circuit 10 has two select transistors 20, 30 with programmable memory elements 12, 14 located at the central STI region 18. These are serially formed by high-k dielectric film used for both the switching layer of the central gate structure 40 and for the gate dielectric of the select transistor 20, 30. The central gate 42 is a top electrode of the programmable memory elements 12, 14. The bottom electrode of the programmable memory elements 12, 14 is connected directly to source regions 24, 34 or drain regions 26, 36 of select transistor 20, 30. By locating programmable memory elements 12, 14 at the central STI region 18, the programmable memory elements 12, 14 are isolated from the adjacent element, which allows the programmable memory elements 12, 14 to operate individually within a comparatively small cell size area (<1.5 T) while avoiding programming disturbances. By adapting the highly manufacturable the high-k gate dielectric, the programmable cell does not need any additional deposition of resistive films or extra process steps. As a result, the integrated circuit 10 may be scaled down following the evolution of CMOS technology. In addition, the integrated circuit 10 may be simply dropped on a logic intellectual property or circuit in need of a non-volatile memory (NVM) array or discrete storages in advanced system on chip (SOC) logic NVM applications.

In one time programmable (OTP) once the programmable memory element 12, 14 is programmed, it cannot be altered. Exemplary OTP applications include read only memory (ROM), floating gate memory, electrical fuse, and anti-fuse. In multi-time programmable (MTP) the programmable memory element 12, 14 can be reprogrammed. Exemplary MTP applications include Electrically Erasable Programmable Read-Only Memory (EEPROM), flash memory, Silicon-Oxide-Nitride-Oxide-Silicon (SONOS) Memory, Ferroelectric Random-access memory (FRAM), and Resistive random-access memory (RRAM).

In an embodiment of the integrated circuit 10, a top surface 19 of the central STI region 18 is recessed relative to a top surface 27, 37 of the first and second drain regions 26, 36 of the semiconductor substrate 16. Stated differently, the top surface 19 of the central STI region 18 is below the top surface 27, 37 of the first and second drain regions 26, 36 of the semiconductor substrate 16 and, accordingly, the medial dielectric region 52 is below the first and second lateral dielectric regions 54, 56 of the central gate dielectric layer 50.

In an embodiment of the integrated circuit 10, the first lateral dielectric region 54 has a first stepped portion 55 that extends from the medial dielectric region 52 and overlies the first drain region 26. The second lateral dielectric region 56 has a second stepped portion 57 that extends from the medial dielectric region 52 and overlies the second drain region 36. In an embodiment of the integrated circuit 10, the first and second stepped portions 55, 57 extend from the top surface 19 of the central STI region 18 to the top surfaces 27, 37 of the first and second drain regions 26, 36.

In an embodiment of the integrated circuit 10, a first lateral STI region 82 is formed in and on the semiconductor substrate 16 on a first source side of the first select transistor 20 and a second lateral STI region 84 is formed in and on the semiconductor substrate 16 on a second source side of the second select transistor 30. The first and second lateral STI regions 82 effectively delimit the unit cell 11 in the integrated circuit 10.

The integrated circuit 10 further includes a first select transistor 20 and a second select transistor 30 overlying fins 17 of the semiconductor substrate 16. As referred to herein, the terms "over" or "overlying" are understood to mean that an intervening layer may lie between the overlying structure and the underlying structure, or "on" such that the overlying structure directly physically contacts the underlying structure. As used herein, the terms "directly over" or "directly overlying" are understood to mean that the recited features are disposed such that a vertical line passing through the upper component also passes through the lower component, with at least a portion of the upper component directly over at least a portion of the lower component.

In an embodiment of the integrated circuit 10, the first select transistor 20 is formed in and on a first region or fin 17 of the semiconductor substrate 16 having a first dopant profile and the second select transistor 30 is formed in and on a second region or fin 17 of the semiconductor substrate 16 having a second dopant profile. In an embodiment, the first and second dopant profiles are the same low-voltage dopant profile. In an embodiment, a CMOS transistor is used to drive the applied voltage on the integrated circuit 10. In an embodiment, this is done using a relative voltage threshold (RVT)/high voltage threshold (HVT) device with a threshold voltage in the range of about 0.4-0.7 volts. In an embodiment, the first and second source/drain regions 24, 26, 34, 36 are doped with n-type conductivity-determining ions and the first and second regions or fins 17 of the semiconductor substrate 16 are doped with p-type conductivity-determining ions. In an embodiment of the integrated circuit 10, the central STI region 18 is disposed between the first and second regions or fins 17 of the semiconductor substrate 16.

The first select transistor 20 includes a first select gate structure 22, a first source region 24, and a first drain region 26 in contact with a first portion 28 of the central STI region 18. The second select transistor 30 similarly includes a second select gate structure 32, a second source region 34, and a second drain region 36 in contact with a second portion 38 of the central STI region 18. The first drain region 26 is opposite the second drain region 36 relative to the central STI region 18.

The select transistors 20, 30 function to control the programming of programmable memory elements 12, 14 by enabling or inhibiting current flow between the central gate 42 and the source regions 24, 34, through the programmable memory elements 12, 14, based upon a voltage bias applied to the select gate structures 22, 32. The select gate structures 22, 32 include select gates 60, 70 and select dielectric layers 62, 72. In an embodiment of the integrated circuit 10, the first select gate structure 22 includes the first select gate 60 and the first select dielectric layer 62. The second select gate structure 32 includes the second select gate 70 and the second select gate dielectric layer 72. In embodiments, the select dielectric layers 62, 72 include an oxide, such as silicon oxide. In embodiments, the select dielectric layers 62, 72, as well as the central gate dielectric layer 72, are high-k dielectric layers, meaning the select dielectric layers 62, 72 and central gate dielectric layer 72 have a higher dielectric constant as compared to silicon dioxide, for example. The term "high-k dielectric" should not be interpreted as limiting the select dielectric layers 62, 72 to any one material or composition, but to encompass materials and compositions understood as having high dielectric constants. In an embodiment, the select dielectric layers 62, 72 as well as the central dielectric layer 50 can be formed at the same time as formation of other gate dielectric layers in the integrated circuit 10, thereby avoiding additional masking or processing stages beyond those present in existing fabrication stages and minimizing process costs. The source regions 24, 34 and drain regions 26, 36 are doped with conductivity-determining ions in accordance with conventional transistor formation techniques. In embodiments, the source regions 24, 34 and drain regions 26, 36 are doped with N-type conductivity-determining ions such as, but not limited to, arsenic, phosphorus, or antimony.

Figure 2:
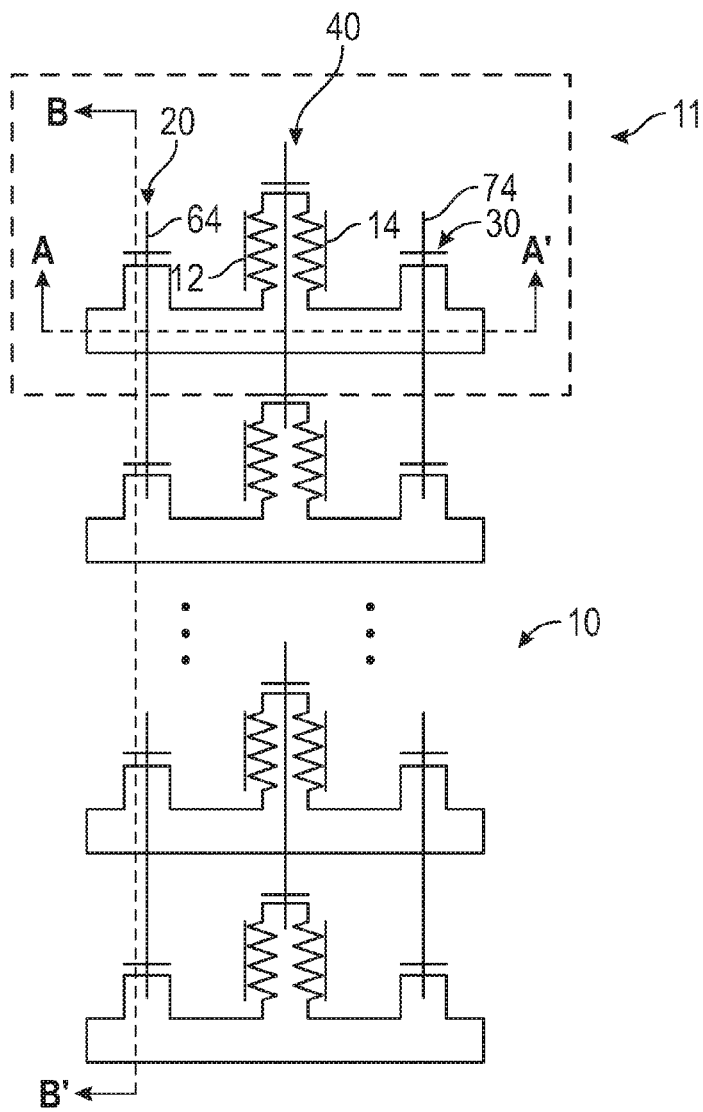
FIG. 2 is a circuit diagram of the integrated circuit of FIG. 1.

With reference now to FIG. 2, a circuit diagram of the integrated circuit 10 includes a plurality of unit cells 11 as detailed above and illustrated in FIG. 1. Each unit cell 11 of the integrated circuit has the select transistors 20, 30 and the programmable memory elements 12, 14 of the central gate structure 40. A plurality of the unit cells 11 allow for varying numbers of unit cells 11 within the integrated circuit 10 and, accordingly, varying numbers of programmable memory elements 12, 14.

The select transistors 20, 30 are coupled in series with the programmable memory elements 12, 14, respectively. The equivalent circuit for the programmable memory elements 12, 14 is a capacitor. Programmable memory elements 12, 14 each form a one transistor OTP or one transistor MTP element where the select transistor 20, 30 is used to select the memory element 12, 14 for program/erase operation and read operation. The operation of the integrated circuit 10 will now be described with respect to the programmable memory element 12 although one skilled in the art will appreciate that the following applies to programmable memory element 14 as well.

At the beginning state, the programmable memory element 12 is in a high resistance state. Since there is no current that flows along the bitline, the programmable memory element 12 is a logic "0" by default. To program the programmable memory element 12 by writing a logic "1" data bit into the programmable memory element 12, a supply voltage is applied to the gate of the select transistor 20 and a second supply voltage is applied to the central gate structure 40 of the integrated circuit 10. The source region 24 of the select transistor 20 is used as a bit line and is connected to ground. Accordingly, when the selector transistor 20 is turned on, a positive voltage difference is created between the first lateral dielectric region 54 of the central gate structure 40 and the drain region 26 of the select transistor 20. In this way, the integrated circuit 10 can efficiently switch the programmable memory element 12 between high and low resistive states.

For MTP application, programmable memory element 12 is able to reset back to the high resistance state. To write a logic "0" data bit into the programmable memory element 12 in an erasing operation, a supply voltage is applied to the select gate 60 of the select transistor 20 and the second supply voltage is applied to the source region 24. The central gate structure 40 is connected to ground. Accordingly, the when the selector transistor 20 is turned on, a negative voltage difference is created between the first lateral dielectric region 54 of the central gate structure 40 and the drain region 26 of the select transistor 20. In this way, the integrated circuit 10 can efficiently switch the programmable memory element 12 between high and low resistive states.

Figure 3:
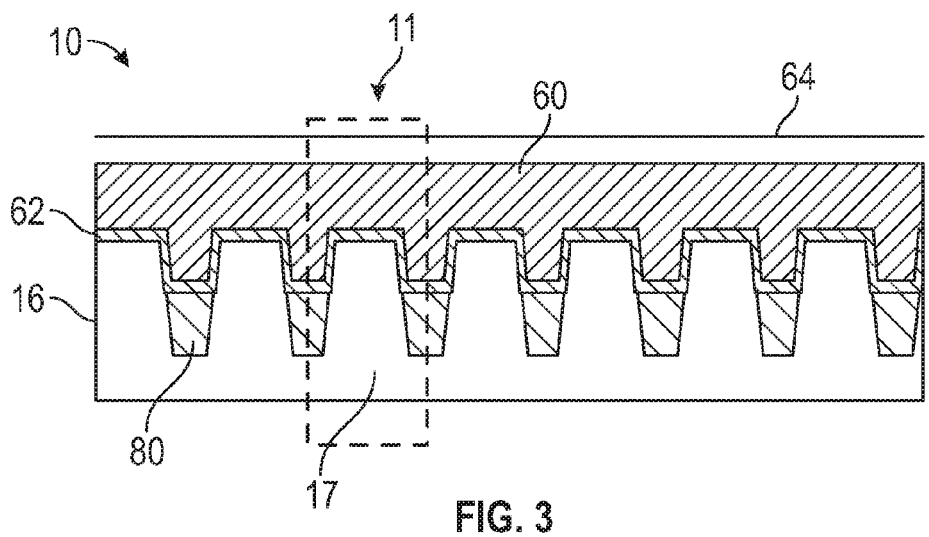
FIG. 3 is a schematic cross-sectional side view of the integrated circuit of FIG. 2 along the line B-B'.

FIG. 3 is a schematic cross-sectional side view of the integrated circuit 10 taken along the line B-B' shown in FIG. 2. With reference to FIG. 3 and further considering FIGS. 1 and 2, a plurality of fins 17 of the semiconductor substrate 16 are shown through a central portion of the select transistor 20. The fins 17 of adjacent unit cells 11 of the integrated circuit 10 are separated by separating STI regions 80. In embodiments, the select dielectric layer 62 overlies the fins 17 and separating STI regions 80 in a continuous layer so that the dielectric layers of the select transistor 20 and other dielectric layers of the integrated circuit 10 can be formed at the same time, thereby avoiding additional masking or processing stages beyond those present in existing fabrication stages and minimizing process costs.

In an embodiment of the integrated circuit 10 shown in FIG. 2, a first select gate wordline contact 64 is disposed over and in electrical communication with the first select gate 60. A second select gate wordline contact 74 is disposed over and in electrical communication with the second select gate 70.

Conventional layer deposition and patterning techniques employed in transistor and floating gate fabrication may be employed to form the integrated circuit 100. Embodiments of a method 200 will now be described with reference to the cross-sectional views of FIGS. 4 A-H. Throughout FIGS. 4 A-H, the cross-sectional views of the integrated circuit 100 are similar to those of FIG. 3 to depict the method 200 of forming the integrated circuit 100 taken along the line B-B' with respect to FIG. 2. Likewise, throughout FIGS. 5 A-H, the cross-sectional views of the integrated circuit 100 are similar to those of FIG. 1 to depict the method 200 of forming the integrated circuit 100 taken along the line A-A' with respect to FIG. 2.

Figures 4D, 5D:
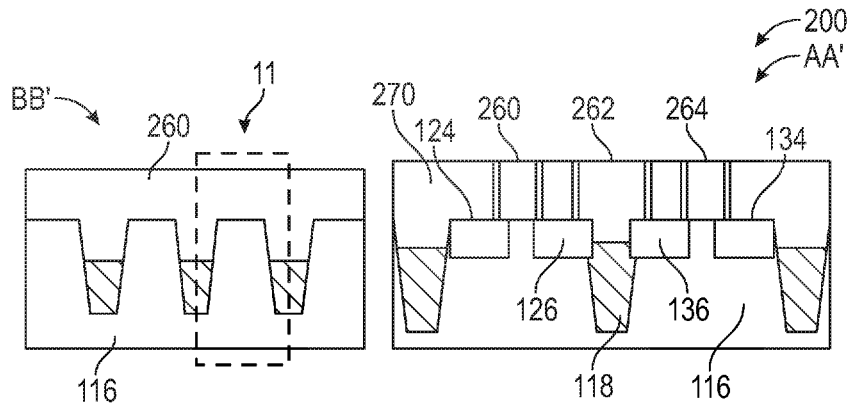
FIGS. 4 A-H are schematic cross-sectional side views similar to FIG. 3 of the integrated circuit of FIG. 1 being formed by a method in accordance with an embodiment.
FIGS. 5 A-H are schematic cross-sectional side views similar to FIG. 1 of the integrated circuit of FIG. 1 being formed by a method in accordance with an embodiment.
Figures 4E, 5E:
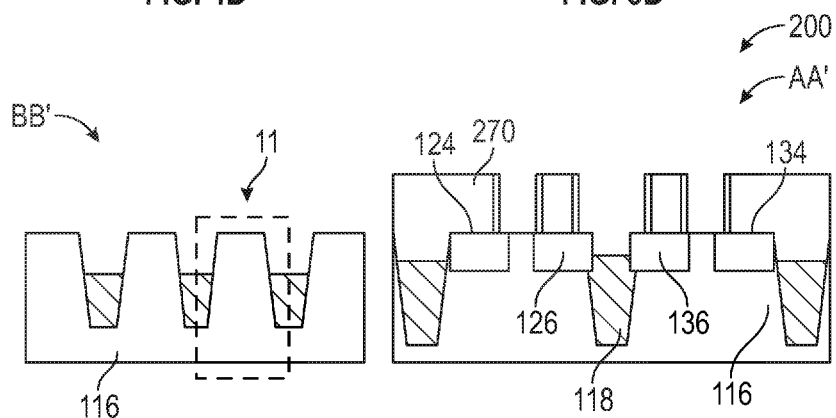
Figures 4F, 5F:
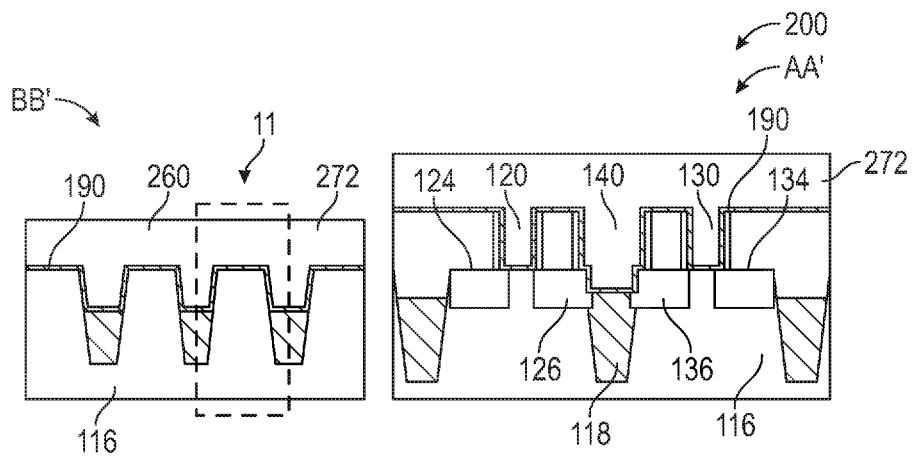

In FIGS. 4A and 5A, the semiconductor substrate 116 having the first and second semiconductor fins 117a, 117b is provided. The recessed central STI region 118 is formed between the first and second semiconductor fins 117a, 117b and separating STI regions 180 are formed between the unit cells 111. In FIGS. 4B and 5B, a plurality of dummy gates 260, 262, 264 are formed. In FIGS. 4C and 5C, the source regions 124, 134 and drain regions 126, 136 are formed by implanting dopant(s) in the semiconductor substrate 116. In FIGS. 4D and 5D, a silicidation layer and an inter-layer dielectric (ILD) 270 are formed and chemical mechanical planarization (CMP) is performed on the integrated circuit 100. In FIGS. 4E-5F and 5E-6F, the dummy gates 260, 262, 264 are removed and a dielectric layer 190 is formed. Gate material 272 is also formed on the dielectric layer 190 to fill in the gate structures 120, 130, 140.

Figure 4G:
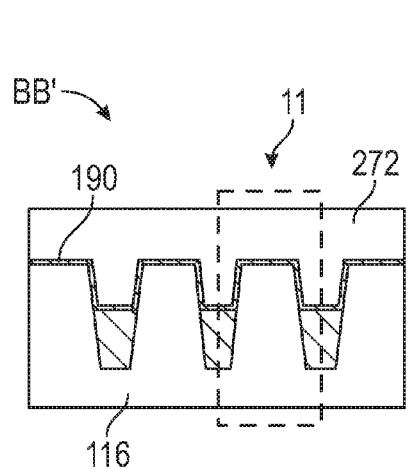
Figure 5G:
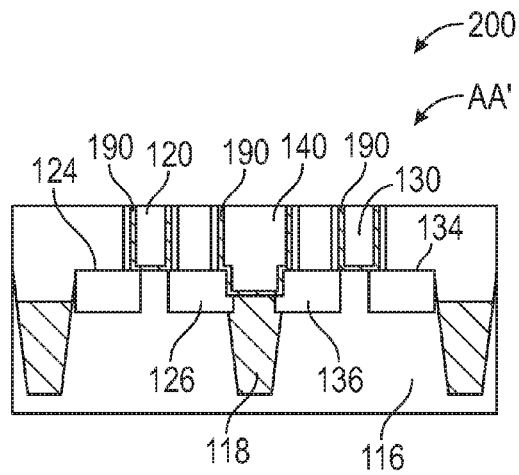
Figure 4H:
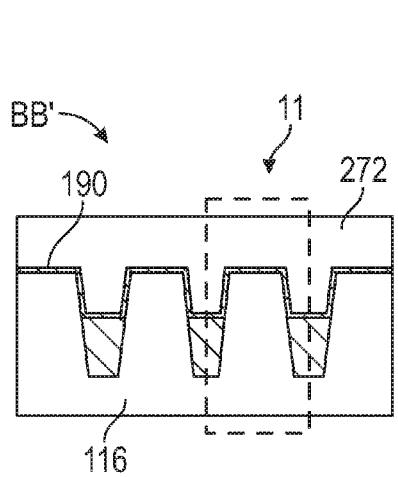
Figure 5H:
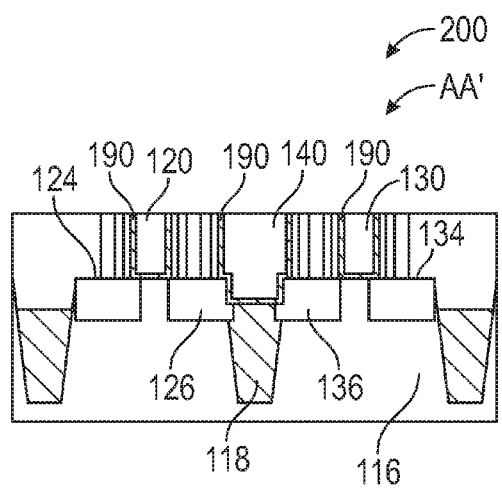

In some embodiments, the central gate structure 140 overlying the drain regions 126, 136 may be formed in accordance with method 200. A dielectric layer 190 of the first select gate 120, the second select gate 130, and the central gate structure 140 may likewise be formed concurrently in accordance with method 200. Furthermore, the dielectric layer 190 may be formed as a high-k dielectric layer in accordance with method 200. In FIGS. 4G and 5G, the integrated circuit 100 is again processed using CMP to remove excess gate material 272 from the gate structures 120, 130, 140. In FIGS. 4H and 5H, the contact/trench metal is formed along with back-end-of-line (BEOL) structures. This exemplary method 200 and depiction of the formation of the integrated circuit 100 is not intended to limit the methods by which the integrated circuit 100 may be formed.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. It being understood that various changes may be made in the function and arrangement of elements described in an exemplary embodiment without departing from the scope as set forth in the appended claims.

What is claimed is:

1. An integrated circuit comprising:
   a semiconductor substrate having a central shallow trench isolation (STI) region; and
   a unit cell including:
      a first select transistor having a first select gate structure, a first source region, and a first drain region in contact with a first portion of the central STI region;
      a second select transistor having a second select gate structure, a second source region, and a second drain region in contact with a second portion of the central STI region, wherein the first drain region is opposite of the second drain region relative to the central STI region; and
      a central gate structure overlying the central STI region and including a central gate dielectric layer having:
         a medial dielectric region overlying the central STI region between the first drain region and the second drain region;
         a first lateral dielectric region overlying the first drain region; and
         a second lateral dielectric region overlying the second drain region;
         wherein the first lateral dielectric region defines a first programmable element and the second lateral dielectric region defines a second programmable element.

2. The integrated circuit of claim 1, wherein a top surface of the central STI region is disposed on a recessed plane relative to a top surface of the first and second drain regions of the semiconductor substrate.

3. The integrated circuit of claim 1, wherein the first lateral dielectric region has a first stepped portion extending from the medial dielectric region and overlying the first drain region, and wherein the second lateral dielectric region has a second stepped portion extending from the medial dielectric region and overlying the second drain region.

4. The integrated circuit of claim 3, wherein the first stepped portion extends from a top surface of the central STI region to a top surface of the first drain region, and wherein the second stepped portion extends from the top surface of the central STI region to a top surface of the second drain region.

5. The integrated circuit of claim 1, further comprising a first lateral STI region formed in and on the semiconductor substrate on a first source side of the first select transistor and a second lateral STI region formed in and on the semiconductor substrate on a second source side of the second select transistor.

6. The integrated circuit of claim 1, wherein the first select transistor is formed in and on a first region of the semiconductor substrate having a first dopant profile and the second select transistor is formed in and on a second region of the semiconductor substrate having a second dopant profile, wherein the first and second dopant profiles comprise the same low-voltage dopant profile.

7. The integrated circuit of claim 6, wherein the source and drain regions comprise doped source and drain regions having n-type conductivity-determining ions, and wherein the first and second regions of the semiconductor substrate comprise first and second doped regions having p-type conductivity-determining ions.

8. The integrated circuit of claim 6, wherein the central STI region is disposed between the first and second regions of the semiconductor substrate.

9. The integrated circuit of claim 1, wherein the first select gate structure comprises a first select gate and a first select dielectric layer, and wherein the second select gate structure comprises a second select gate and a second select dielectric layer.

10. The integrated circuit of claim 9, wherein the unit cell further comprises a first select gate wordline contact disposed in electrical communication with the first select gate.

11. The integrated circuit of claim 9, wherein the unit cell further comprises a second select gate wordline contact disposed in electrical communication with the second select gate.

12. The integrated circuit of claim 9, wherein each of the first select dielectric layer, the second select dielectric layer, and the central gate dielectric layer comprises a high k dielectric layer.

13. The integrated circuit of claim 1, wherein the central gate structure is further disposed directly over the first and second drain regions with the first and second dielectric regions sandwiched between a central gate and the first and second drain regions, respectfully.

14. A method of forming an integrated circuit, the method comprising:
   providing a semiconductor substrate having a first semiconductor fin and a second semiconductor fin;
   forming a recessed central shallow trench isolation (STI) region between the first and second semiconductor fins;
   forming a first select transistor overlying a top surface of the first semiconductor fin, the first select transistor having a first select gate structure, a first source region, and a first drain region in contact with a first portion of the recessed central STI region;
   forming a second select transistor overlying a top surface of the second semiconductor fin, the second select transistor having a second select gate structure, a second source region, and a second drain region in contact with a second portion of the recessed central STI region, the second drain region is opposite of the first drain region relative to the central STI region; and
   forming a central gate structure overlying the recessed central STI region including a central gate dielectric layer having:
      a medial dielectric region overlying the central STI region between the first drain region and the second drain region;
      a first lateral dielectric region overlying the first drain region; and
      a second lateral dielectric region overlying the second drain region;
   wherein the first lateral dielectric region defines a first programmable element and the second lateral dielectric region defines a second programmable element.

15. The method of claim 14, wherein the central gate structure is further formed overlying the drain regions.

16. The method of claim 14, wherein a dielectric layer of the first select transistor, the second select transistor, and the central gate structure are all concurrently formed.

17. The method of claim 16, wherein the dielectric layer comprises a high k dielectric layer.

18. An integrated circuit comprising:
   a semiconductor substrate having a first semiconductor fin and a second semiconductor fin with a recessed central shallow trench isolation (STI) region disposed there between;
   a unit cell including:
      a first select transistor overlying the first semiconductor fin, the first select transistor having a first select gate structure, a first source region, and a first drain region in contact with a first side of the recessed central STI region;

a second select transistor overlying the second semiconductor fin, the second select transistor having a second select gate structure, a second source region, and a second drain region in contact with a second side of the recessed central STI region opposite the first side; and a central gate structure overlying the recessed central STI region having a central dielectric layer, the central dielectric layer having a medial dielectric region formed on the recessed central STI region between the first drain region and the second drain region, a first lateral dielectric region in contact with the first drain region, and a second lateral dielectric region in contact with the second drain region;

wherein the first lateral dielectric region defines a first programmable element and the second dielectric lateral region defines a second programmable element.

19. The integrated circuit of claim 18, wherein a top surface of the recessed central STI region is recessed relative to a top surface of the first and second semiconductor fins, wherein the first lateral dielectric region has a first stepped portion overlying the first drain region, and wherein the second lateral dielectric region has a second stepped portion overlying the second drain region.

20. The integrated circuit of claim 19, wherein the first stepped portion extends from a top surface of the recessed central STI region to a top surface of the first drain region, and wherein the second stepped portion extends from the top surface of the recessed central STI region to a top surface of the second drain region.

* * * * *